(12) United States Patent
Takiguchi et al.

(10) Patent No.: US 10,014,190 B2
(45) Date of Patent: Jul. 3, 2018

(54) LIQUID PROCESSING APPARATUS

(71) Applicant: TOKYO ELECTRON LIMITED, Tokyo (JP)

(72) Inventors: Yasushi Takiguchi, Koshi (JP); Koki Yoshimura, Koshi (JP); Taro Yamamoto, Koshi (JP); Hideharu Kyouda, Koshi (JP); Koshi Muta, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 508 days.

(21) Appl. No.: 14/339,539

(22) Filed: Jul. 24, 2014

(65) Prior Publication Data

US 2015/0027503 A1    Jan. 29, 2015

(30) Foreign Application Priority Data

Jul. 26, 2013    (JP) ................................ 2013-156115

(51) Int. Cl.
    *H01L 21/67*      (2006.01)

(52) U.S. Cl.
    CPC .... *H01L 21/67051* (2013.01); *H01L 21/6715* (2013.01)

(58) Field of Classification Search
    CPC .................................................. H01L 21/67051
    See application file for complete search history.

(56) References Cited

U.S. PATENT DOCUMENTS

| | | | |
|---|---|---|---|
| 2007/0223342 A1* | 9/2007 | Orii | H01L 21/02052 369/69 |
| 2012/0260947 A1* | 10/2012 | Kaneko | B08B 3/10 134/19 |
| 2013/0014786 A1* | 1/2013 | Ito | H01L 21/02041 134/34 |

FOREIGN PATENT DOCUMENTS

| | | |
|---|---|---|
| JP | 2010-056318 A | 3/2010 |
| JP | 2012-015385 A | 1/2012 |
| JP | 2012-054406 A | 3/2012 |
| JP | 2012-070003 A | 4/2012 |
| JP | 2012-151238 A | 8/2012 |
| JP | 2013-004623 A | 1/2013 |

\* cited by examiner

*Primary Examiner* — Jason Ko
(74) *Attorney, Agent, or Firm* — Nath, Goldberg & Meyer; Jerald L. Meyer

(57) ABSTRACT

A liquid processing apparatus for performing liquid processing with respect to a substrate using processing fluid, includes: a plurality of substrate holding units arranged side by side in a left-right direction; a nozzle configured to supply the processing fluid to the substrate held in each of the substrate holding units; and a nozzle moving mechanism configured to move the nozzle forward and backward in a front-rear direction intersecting an arrangement direction of the substrate holding units between a supplying position in which the processing fluid is supplied to a region including a central portion of the substrate and a waiting position which is defined at a rear side of a row of the substrate holding units opposite to a front side of the row of the substrate holding units at which the substrate is loaded and unloaded.

15 Claims, 15 Drawing Sheets

LIQUID PROCESSING APPARATUS

CROSS-REFERENCE TO RELATED APPLICATION

This application claims the benefit of Japanese Patent Application No. 2013-156115, filed on Jul. 26, 2013, in the Japan Patent Office, the disclosure of which is incorporated herein in its entirety by reference.

TECHNICAL FIELD

The present disclosure relates to a liquid processing apparatus that performs liquid processing by supplying a processing fluid from a nozzle to a substrate, e.g., a semiconductor wafer or a liquid crystal display glass substrate (an LCD substrate).

BACKGROUND

In a photoresist process as one of the manufacturing processes of a semiconductor device, a resist pattern is formed by coating a resist on a surface of a semiconductor wafer (hereinafter referred to as a "wafer") and by exposing and then developing the resist in a specified pattern. This processing is usually performed by a system in which an exposing apparatus is connected to a coating/developing apparatus for coating and developing a resist. A variety of liquid processing apparatuses for supplying processing liquid such as resist liquid and developing liquid to a wafer are built in the coating/developing apparatus.

In the related art, there is available a coating/developing apparatus in which a coating process unit block for performing a coating process of chemical solution such as a resist and a developing process unit block for performing a developing process are stacked one above another. A developing unit such as a liquid processing unit is installed in the developing process unit block. In the developing unit, for example, three developing process sections are arranged side by side along a wafer transfer region. Developing nozzles for supplying the developing liquid are respectively installed in the developing process sections. The developing nozzles are arranged in a parallel relationship with the developing process sections along an arrangement direction of the developing process sections in a parallel relationship with the developing process sections. The developing nozzles are configured to move in the arrangement direction of the developing process sections.

A study was conducted to further increase a size of the wafer size from 300 mm to 450 mm. In the study, the developing process sections became larger in conformity with the size of the wafer. In the configuration in which the developing process sections and the developing nozzles are arranged side by side along the arrangement direction as set forth above, spaces corresponding to the installation spaces of the developing nozzles are needed in the arrangement direction. For that reason, a length of the apparatus in the arrangement direction becomes larger, leading to an increase in the size of the apparatus. When a plurality of nozzles are installed with respect to one developing process section, spaces are additionally needed in the arrangement direction. Further, the moving distance of a nozzle disposed apart from the developing process section becomes longer. This may lead to a prolonged processing time and a reduced throughput. When the number of liquid processing apparatuses is increased in order to enhance the throughput, not only spaces for the liquid processing apparatuses but installation spaces for the developing nozzles are needed. Thus, the apparatus become considerably large in size. Moreover, when the length in the arrangement direction is increased and the wafer transfer region is extended, a longer time may be taken in transferring the wafer, thus deteriorating the throughput.

In the related art, there is also available a configuration in which a plurality of nozzle support arms are provided in one liquid processing apparatus. The nozzle support arms are arranged so that longitudinal axes of the arms may be located in different circumferential positions of the liquid processing apparatus. Thus, the nozzle support arms move toward or away from the wafer without interfering with one another. A plurality of liquid processing apparatuses are provided side by side along a wafer transfer region. The nozzle support arms are configured to move forward and backward in an arrangement direction of the liquid processing apparatuses. According to this configuration, when the liquid processing apparatuses becomes larger as the diameter of the wafer increases, the nozzle support arm needs to be lengthened in conformity with the size of the wafer. Thus, the length of the apparatus in the arrangement direction increases as much as the liquid processing apparatuses becomes larger and the nozzle support arm is lengthened. In addition, in order to increase the number of the liquid processing apparatuses, installation spaces corresponding to the lengths of the nozzle support arms are needed, thus increasing the size of the apparatus considerably.

SUMMARY

In some embodiments of the present disclosure a liquid processing apparatus is provided which includes a plurality of substrate holding units and which is configured to perform a liquid processing by supplying processing fluid from a nozzle to substrates held in the substrate holding units.

According to an embodiment of the present disclosure, a liquid processing apparatus for performing liquid processing with respect to a substrate using processing fluid is provided. The liquid processing apparatus includes: a plurality of substrate holding units arranged side by side in a left-right direction, each of the substrate holding units configured to horizontally hold the substrate; a nozzle provided in a corresponding relationship with each of the substrate holding units, the nozzle configured to supply the processing fluid to the substrate held in each of the substrate holding units; and a nozzle moving mechanism configured to move the nozzle forward and backward in a front-rear direction intersecting an arrangement direction of the substrate holding units between a supplying position in which the processing fluid is supplied to a region including a central portion of the substrate and a waiting position which is defined at a rear side of a row of the substrate holding units opposite to a front side of the row of the substrate holding units at which the substrate is loaded and unloaded.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
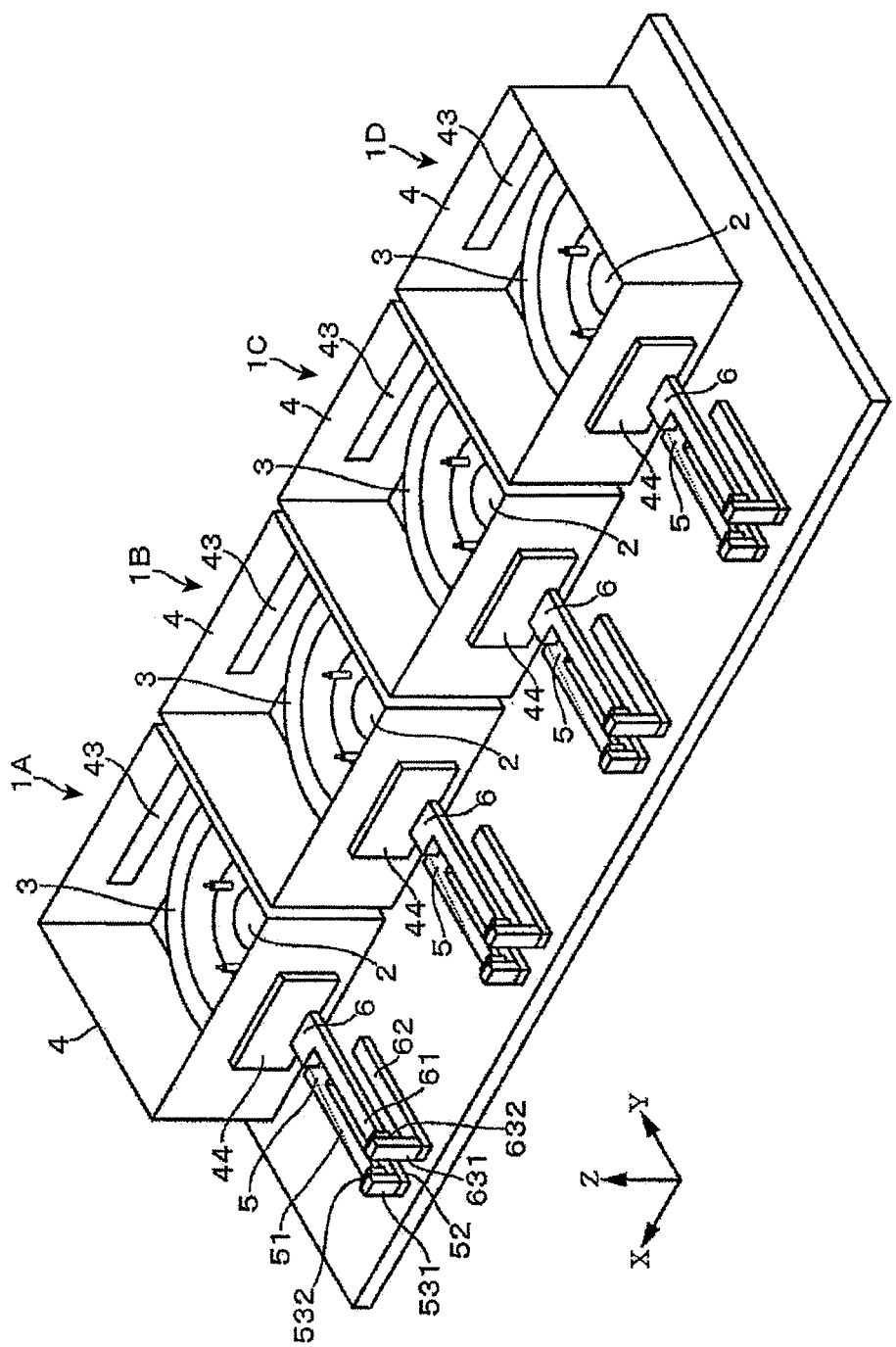
FIG. 1 is a perspective view showing a developing apparatus to which a liquid processing apparatus according to the present disclosure is applied.

In the below-mentioned embodiments, an example where a liquid processing device of the present disclosure is applied to a developing apparatus installed in a coating/developing apparatus will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the same or similar elements are denoted by the same or similar reference numerals.

Figure 2:
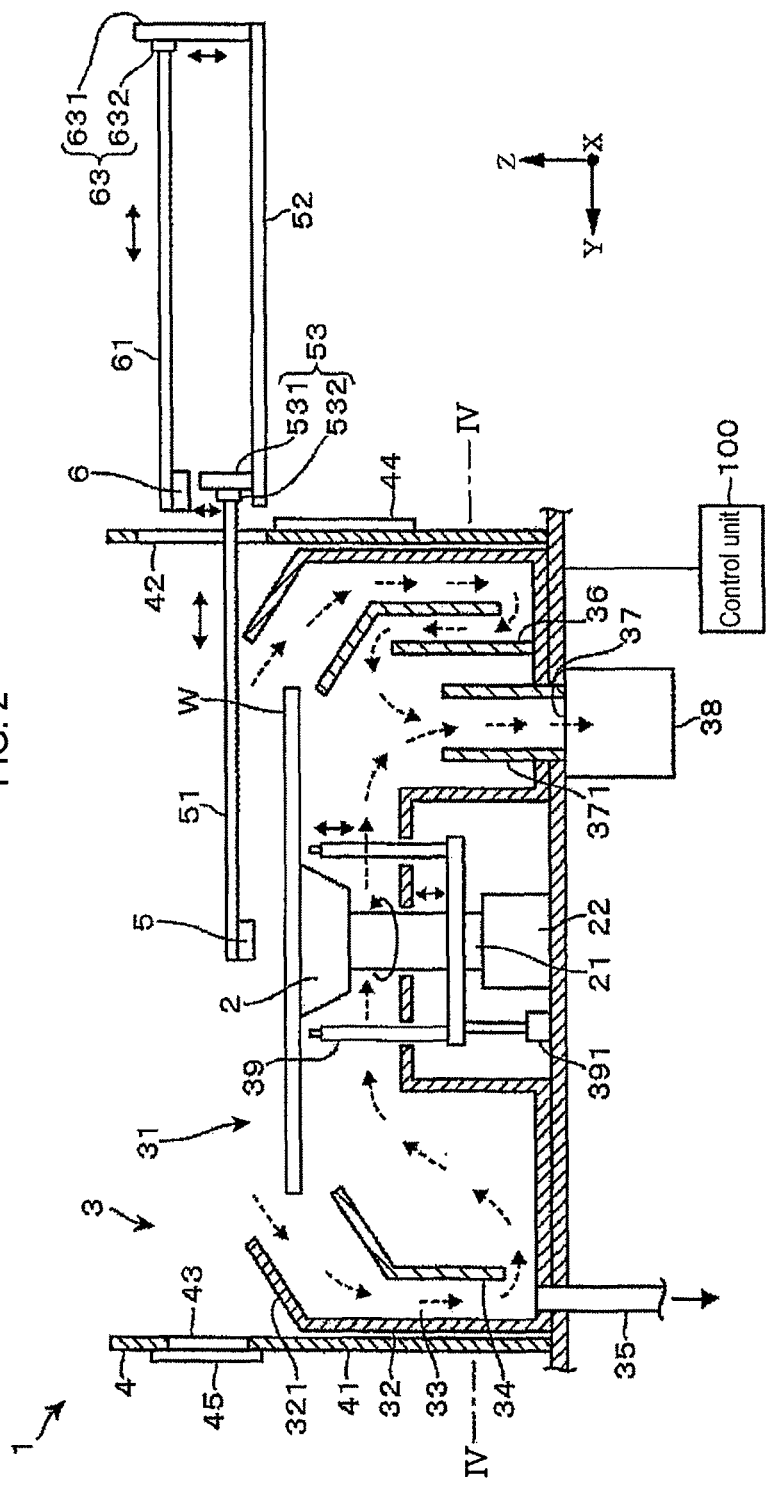
FIG. 2 is a vertical sectional view showing a developing process section that constitutes a developing apparatus.
Figure 3:
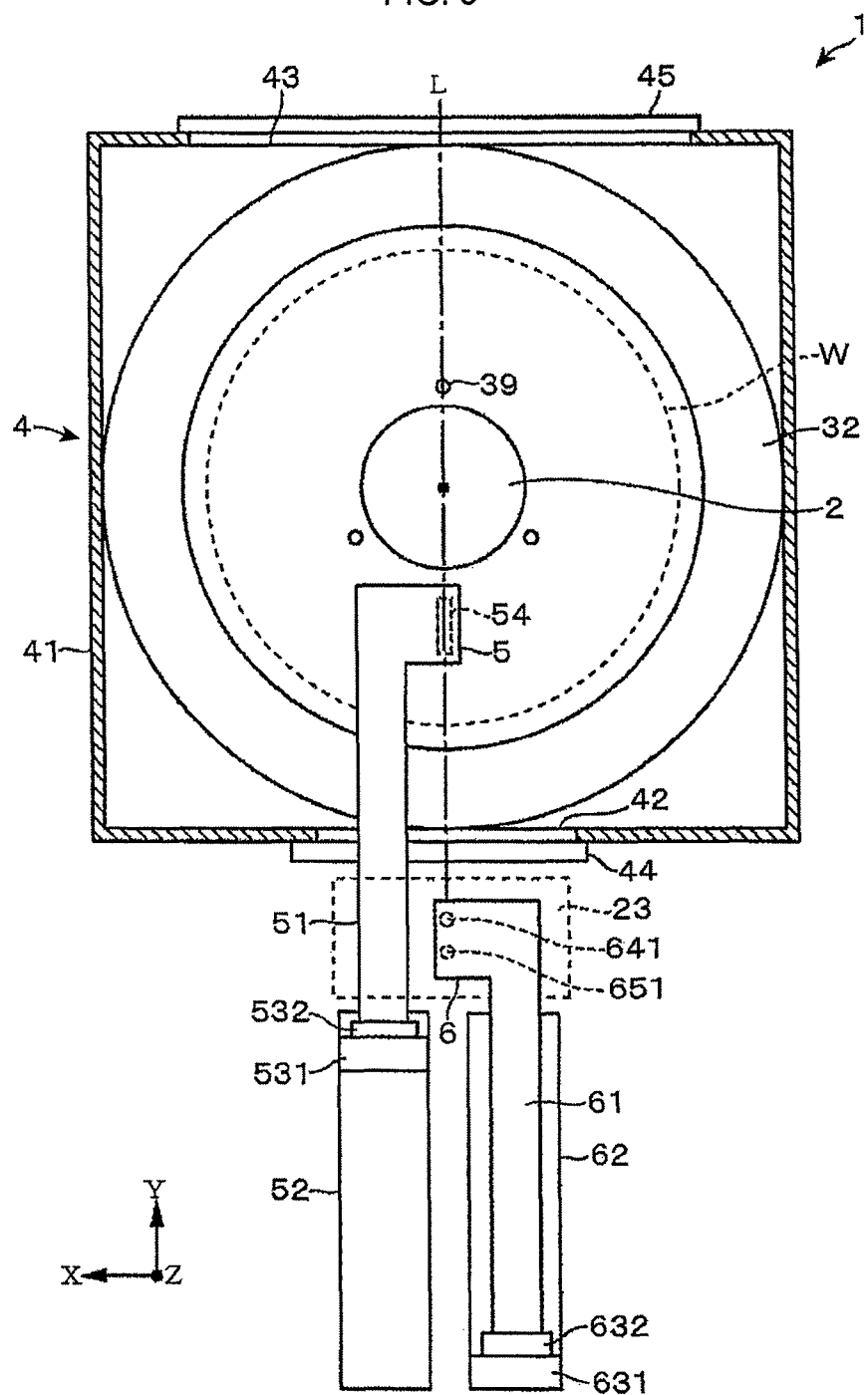
FIG. 3 is a plan view showing a developing process section.

FIG. 1 is a schematic perspective view showing an embodiment of a developing apparatus. FIG. 2 is a vertical sectional side view showing an embodiment of a developing process section installed in the developing apparatus. FIG. 3 is a plan view showing the developing process section. A liquid processing apparatus according to the present disclosure includes a plurality of developing process sections 1. In this example, as shown in FIG. 1, four developing process sections 1 (1A to 1D) are arranged side by side in an X-direction, i.e. in a left-right direction (a first direction). The developing process sections 1A to 1D are identical in configuration with one another and will now be described with reference to the drawings.

Each of the developing process sections 1 includes a spin chuck 2 that serves as a substrate holding unit for sucking and holding a wafer W in a horizontal posture. The spin chuck 2 is configured to horizontally suck and hold the central region of a rear surface of the wafer W and is rotatable about a vertical axis. The term "horizontal" referred to herein is intended to encompass a case where the wafer W is substantially horizontally held. The spin chuck 2 has a circular shape when seen in a plan view and is connected to a drive mechanism (a spin chuck motor) 22 through a rotary elevating shaft 21. The spin chuck 2 is configured to be rotated and moved up and down by the drive mechanism 22. The spin chuck 2 is connected to a suction pipe not shown and serves as a vacuum chuck that holds the wafer W while sucking the wafer W through a suction hole not shown. The wafer W is loaded onto or unloaded from the spin chuck 2 at the front side of a front-rear direction (a second direction) intersecting the arrangement direction of the spin chucks 2.

In order to suppress scattering of developing liquid as processing fluid and to recover the developing liquid, a cup body 3 having a ring shape when seen in a plan view is installed around the spin chuck 2 so as to surround, over the entire circumference, a lateral side and a lower side of the wafer W held in the spin chuck 2. An upper portion of the cup body 3 has an opening 31 larger in diameter than the wafer W. The wafer W can be delivered through the opening 31 between a transfer mechanism of a coating/developing apparatus to be described later and the spin chuck 2. The cup body 3 includes a sidewall 32. An upper end portion of the sidewall 32 is inclined inward to form a slant portion 321. The bottom portion of the cup body 3 forms a liquid receiving portion 33 having, e.g., a recess shape. The liquid receiving portion 33 is divided into an outer region and an inner region by an internal cup 34 over the entire circumference at the lower side of the wafer W. A liquid drain path 35 for draining the retained developing liquid therethrough is connected to a bottom surface portion of the outer region.

Figure 4:
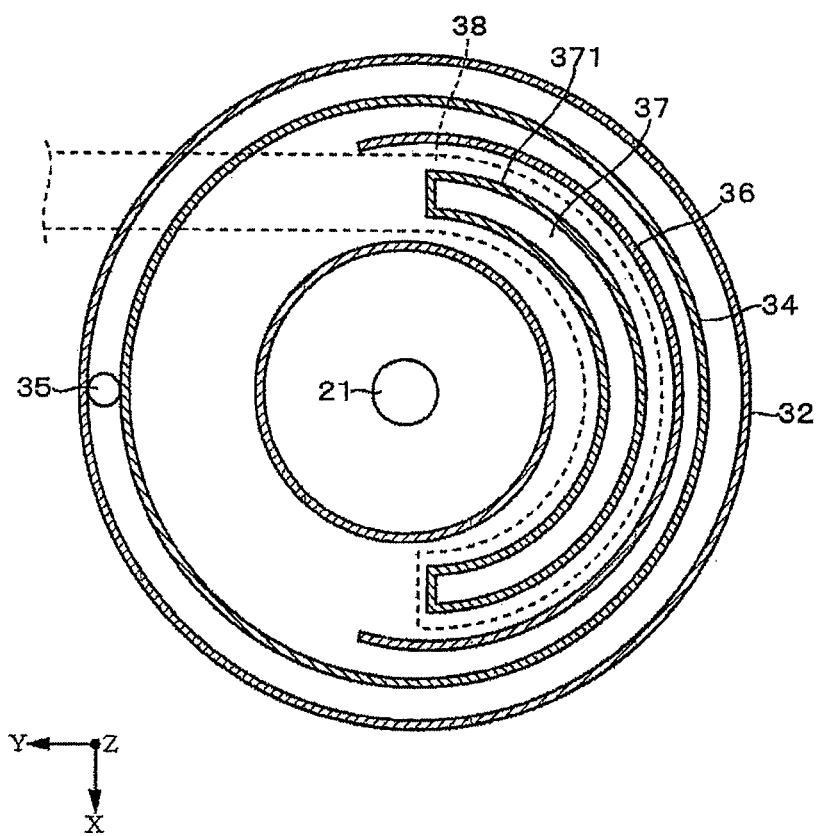
FIG. 4 is a plan view showing a cup body installed in a developing process section.

FIG. 4 is a plan view showing the cup body 3 cut along line IV-IV in FIG. 2. As shown in FIGS. 2 and 4, an airflow controlling partition wall portion 36 is installed in the inner region. The partition wall portion 36 has, e.g., an arc shape which forms a portion of a circle concentric with the rotary elevating shaft 21 of the spin chuck 2 when seen in a plan view. For example, the partition wall portion 36 is formed in a shape of an arc which is a little larger than a semicircle when seen in a plan view. The partition wall portion 36 is installed in a lopsided position around the spin chuck 2, e.g., in a right section in FIG. 4.

An exhaust port 37 for exhausting ambient air existing within the cup body 3 is formed inside the partition wall portion 36. The exhaust port 37 is formed in the bottom surface portion of the inner region to extend partially along the circumferential direction of the spin chuck 2. For example, the exhaust port 37 is installed such that longitudinal opposite ends of the exhaust port 37 are positioned further inside than opposite ends of the partition wall portion 36. The bottom surface portion of the cup body 3 is annularly formed so as to surround the periphery of the spin chuck 2. When the annular bottom surface portion is divided into two regions in a plan view, the exhaust port 37 is formed in one region (a half region) of the annular bottom surface portion. The exhaust port 37 may be formed by arranging a plurality of exhaust ports. As indicated by a dot line in FIG. 4, the exhaust port 37 is covered by a dedicated exhaust path 38. One end of the dedicated exhaust path 38 is connected to an exhaust mechanism (not shown) through an exhaust path of a factory in which a developing apparatus is installed as described later. Within the cup body 3, the periphery of the exhaust port 37 is defined by, e.g., a wall portion 371 lower in height than the partition wall portion 36.

Around the cup body 3, there is installed a case body 4 that forms an enclosure member for surrounding the wafer W held in the spin chuck 2 and the space existing above the wafer W. The case body 4 has, for example, a rectangular box shape when seen in a plan view, with the upper surface thereof opened. The case body 4 includes a sidewall 41 that surrounds the lateral side of the cup body 3 over the entire circumference of the cup body 3. The upper edge of the sidewall 41 is configured to become higher than the slant portion 321 of the cup body 3. At the lateral side of the spin chuck 2, there are installed support pins 39 which are connected to an elevator mechanism 391 so that the support pins 39 can move up and down while supporting the rear surface of the wafer W. The support pins 39 are configured so that, by cooperation of the support pins 39 with an external transfer mechanism, the wafer W can be delivered between the support pins 39 and the transfer mechanism.

The developing apparatus further includes nozzles installed in the respective developing process sections 1 and configured to supply processing fluid to the wafer W held by the spin chuck 2. In this example, the nozzles include a first nozzle 5 and a second nozzle 6. The first nozzle 5 is used for supplying developing liquid as a first processing fluid. The second nozzle 6 is used for supplying cleaning liquid (rinsing liquid) as a second processing fluid and supplying a drying gas. The first nozzle 5 and the second nozzle 6 are configured to be moved forward and backward in the front-rear direction by a nozzle moving mechanism between a supplying position in which the processing fluid is supplied to the wafer W existing on the spin chuck 2 and a waiting position which is defined at the rear side, namely at the opposite side from the front side at which the wafer W is loaded and unloaded. In this example, the direction in which the first nozzle 5 and the second nozzle 6 move forward and backward is set to be a front-rear direction (a Y-direction) orthogonal to the left-right direction in which the spin chucks 2 are arranged side by side.

The nozzle moving mechanism includes a first arm portion 51 for moving the first nozzle 5 forward and backward and a second arm portion 61 for moving the second nozzle 6 forward and backward. The first arm portion 51 and the second arm portion 61 are disposed apart from each other in the left-right direction. The first arm portion 51 is installed on a base 52 existing outside the case body 4 via a moving mechanism 53. The moving mechanism 53 includes an advance/retreat mechanism 531 that moves forward and backward along the base 52 and extends upward, and an elevator mechanism 532 that moves up and down along the advance/retreat mechanism 531. Thus, as the first arm portion 51 moves forward and backward and moves up and down, the first nozzle 5 is configured to move in the front-rear direction (the Y-direction) between a supplying position in which the developing liquid is supplied to a region including the central portion of the wafer W held in the spin chuck 2 and a waiting position which is defined outside the case body 4.

Figure 5A:
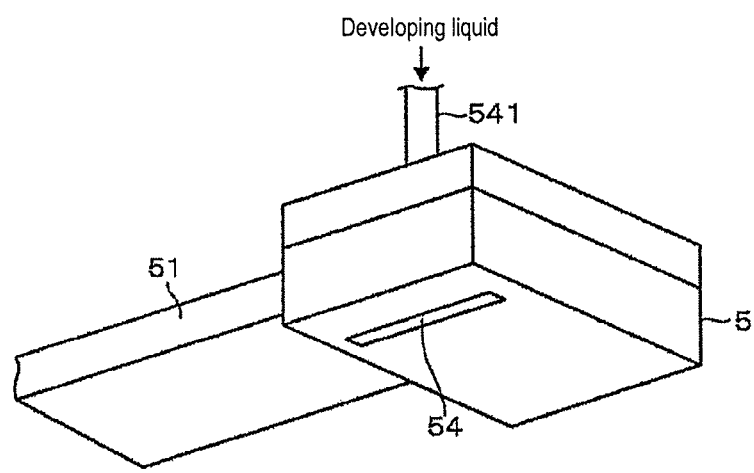
FIGS. 5A and 5B are perspective views showing a first nozzle and a second nozzle installed in a developing process section.

As shown in FIG. 5A, the first nozzle 5 includes a discharge port 54 formed on a lower end surface of the first nozzle 5 and having a narrow elongated slit shape. In this example, the first nozzle 5 is configured to move in the Y-direction. Therefore, the longitudinal direction of the discharge port 54 is parallel to the Y-direction. The first nozzle 5 is configured to discharge the developing liquid in a band-like shape toward the region including the central portion of the wafer W when the first nozzle 5 is at the supplying position. In this example, the length (the dimension in the Y-direction) of the discharge port 54 is set to be smaller than the diameter of the wafer W. For example, the length of the discharge port 54 is set to, e.g., 5 mm to 15 mm, and the width of the discharge port 54 is set to, e.g., 0.1 mm to 1 mm. The discharge port 54 is configured to pass over the diameter of the wafer W held in the spin chuck 2 when the first nozzle 5 moves between the supplying position and the waiting position. The first arm portion 51 is installed more leftward or rightward (leftward in this example) than a straight line L (see FIG. 3) that joins the discharge port 54 of the first nozzle 5 existing at, e.g., the waiting position, and the center of the wafer W held in the spin chuck 2.

Figure 5B:
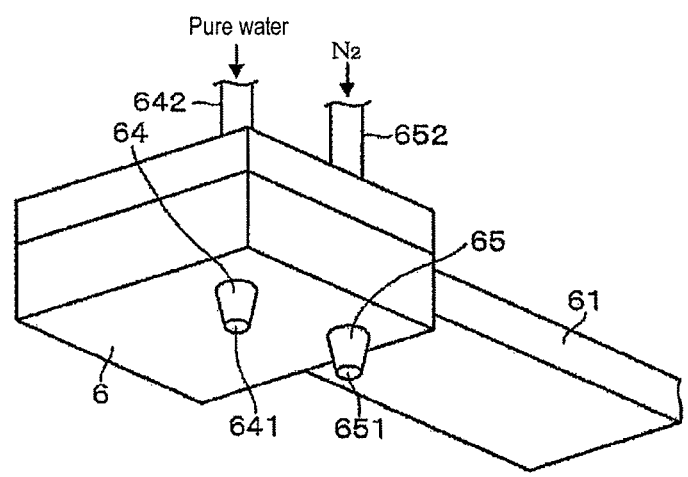

Just like the first arm portion 51, the second arm portion 61 is installed on a base 62 existing outside the case body 4 via a moving mechanism 63. The moving mechanism 63 includes an advance/retreat mechanism 631 that moves forward and backward along the base 62 and extends upward, and an elevator mechanism 632 that moves up and down along the advance/retreat mechanism 631. The second arm portion 61 is configured to extend along the Y-direction on the base 62. The second nozzle 6 of this example, as shown in FIG. 5B, is configured as a composite nozzle that includes a cleaning nozzle portion 64 for discharging cleaning liquid such as pure water and a drying gas nozzle portion 65 for supplying drying gas such as nitrogen gas. Since the second nozzle 6 is configured to move in the Y-direction, the cleaning nozzle portion 64 and the drying gas nozzle portion 65 are installed to adjoin each other in the Y-direction. The cleaning nozzle portion 64 and the drying gas nozzle portion 65 are respectively provided with discharge ports 641 and 651 which are circular fine holes opened vertically downward. The diameter of the discharge ports 641 and 651 is set to, e.g., 0.1 mm to 10 mm.

Thus, the second nozzle 6 is configured to, by virtue of the second arm portion 61, move in the front-rear direction (the Y-direction) between the supplying position in which the cleaning liquid or the drying gas is supplied to the wafer W held in the spin chuck 2 and a waiting position which is defined outside the case body 4. The second nozzle 6 is configured to discharge pure water or nitrogen gas toward the region including the central portion of the wafer W when the second nozzle 6 is at the supplying position. The discharge ports 641 and 651 are configured to pass over the diameter of the wafer W held in the spin chuck 2 when the second nozzle 6 moves between the supplying position and the waiting position. The second arm portion 61 is installed more rightward or leftward (rightward in this example) than the straight line L. In this example, the moving mechanism 53 of the first arm portion 51 and the moving mechanism 63 of the second arm portion 61 constitute a nozzle moving mechanism.

While the first arm portion 51 and the second arm portion 61 are spaced apart from each other in the left-right direction, the discharge port 54 of the first nozzle 5 and the discharge ports 641 and 651 of the second nozzle 6 are respectively arranged so as to supply the developing liquid, etc., toward the region including the central portion of the wafer W. The first nozzle 5 and the second nozzle 6 are installed in such positions that, when alternately moved into the supplying position, the first nozzle 5 and the second nozzle 6 interfere with each other when seen in a plan view. For that reason, in order to avoid the mutual interference, the first nozzle 5 and the second nozzle 6 are configured to move up and down as set forth above. For example, the height positions of the base 52 of the first nozzle 5 and the base 62 of the second nozzle 6 are aligned with each other. The second arm portion 61 is positioned higher than the first arm portion 51. In this example, the first nozzle 5 and the second nozzle 6 are configured to move up and down, but are not limited thereto. In some embodiments, at least one of the first nozzle 5 and the second nozzle 6 may be configured to move up and down.

For example, if the second nozzle 6 is arranged higher than the first nozzle 5 in this way, the first nozzle 5 and the second nozzle 6 can move forward and backward without interfering with each other. As shown in FIG. 3, shapes of the first nozzle 5, the second nozzle 6, the first arm portion 51, and the second arm portion 61 are respectively set such that the first nozzle 5 does not overlap with the second arm portion 61 when seen in a plan view and the second nozzle 6 does not overlap with the first arm portion 51 when seen in a plan view. By moving the second nozzle 6 over the first nozzle 5, positioning the second nozzle 6 more forward than the first nozzle 5 in the advance/retreat direction, and then moving the second nozzle 6 downward, the first nozzle 5 and the second nozzle 6 can move forward and backward between the supplying position and the waiting position without interfering with each other.

The first nozzle 5, the cleaning nozzle portion 64 of the second nozzle 6 and the drying gas nozzle portion 65 of the second nozzle 6 are connected via supply paths 541, 642 and 652 to a developing liquid supply source, a cleaning liquid supply source and a drying gas supply source, respectively, through flow rate control units, each of which includes a valve, a mass flow controller or the like. Responsive to a control signal transmitted from a control unit to be described below, the flow rate control units are configured to control the supply and cutoff of the developing liquid which is supplied from the first nozzle 5 to the wafer W and the supply and cutoff of the cleaning liquid and the drying gas which are supplied from the second nozzle 6 to the wafer W. The flow rate control units, the developing liquid supply source, the cleaning liquid supply source and the drying gas supply source are not shown in the drawings.

Referring back to FIGS. 1 to 3, an opening 42 for a nozzle is formed in the sidewall 41 of the case body 4. The opening 42 allows the first nozzle 5 and the second nozzle 6 to pass therethrough. Furthermore, an opening 43 for a substrate is formed in the sidewall 41 which faces the sidewall 41 of the case body 4 on which the opening 42 for a nozzle is formed. The opening 43 loads and unloads the wafer W therethrough. The opening 42 for a nozzle and the opening 43 for a substrate are configured to be opened and closed by shutters 44 and 45. The opening 42 for a nozzle is normally closed by the shutter 44 and is opened when the first nozzle 5 and the second nozzle 6 are moved forward and backward between the waiting position and the supplying position. Further, the opening 43 for a substrate is normally closed by the shutter 45, and is opened when the wafer W is delivered between the spin chuck 2 and the external transfer mechanism.

Figure 6:
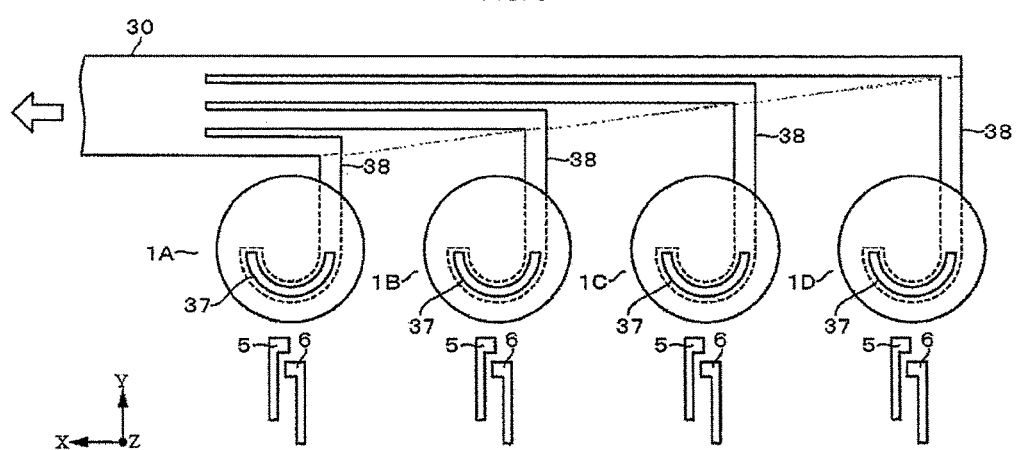
FIG. 6 is a plan view showing an exhaust path of a developing apparatus.

As shown in FIGS. 2 and 6, each of the dedicated exhaust paths 38 for exhausting ambient air existing within the cup body 3 is connected to the exhaust ports 37 formed in the bottom surface portion of the cup body 3. For example, as illustrated in FIG. 6, each of the exhaust ports 37 and each of the dedicated exhaust paths 38 are installed at the rear side in the front-rear direction. Each of the dedicated exhaust paths 38 is installed in a corresponding relationship with the cup body 3. As depicted in FIG. 6, each of the dedicated exhaust paths 38 is drawn toward the front side (the upper side of the sheet surface in FIG. 6) when viewed from a row of the spin chucks 2. The dedicated exhaust paths 38 are connected to a common exhaust path 30 at the downstream side of the downstream-most developing process section 1A.

The dedicated exhaust paths 38 are connected to the aforementioned exhaust mechanism through the common exhaust path 30. In FIG. 6, the outer edges of the cup bodies 3 and the exhaust ports 37 are indicated by solid lines and the dedicated exhaust paths 38 on the bottom surface of the cup body 3 are indicated by dotted lines. For the sake of convenience in illustration, the first nozzle 5 and the second nozzle 6 existing in the waiting position are depicted so as not to overlap with each other. In the coating/developing apparatus to be described below, the dedicated exhaust paths 38 and the common exhaust path 30 existing outside the cup bodies 3 are installed, e.g., between the transfer region of the wafer W and the liquid processing unit.

Pressure regulating units (not shown) installed in respective drive mechanisms 22, the moving mechanisms 53 and 63, the dedicated exhaust paths 38 and the common exhaust path 30 of the developing apparatus are controlled by a control unit 100 which controls the overall operations of the coating/developing apparatus. The control unit 100 is formed from, e.g., a computer that includes a program storage not shown. A computer program including a group of steps (instructions) associated with the operations by which a developing process to be described below is performed using the first nozzle 5 and the second nozzle 6 is stored in the program storage. By reading out the computer program, the control unit 100 controls the operations of the developing process sections 1. The computer program is stored in the program storage, e.g., in a state where the computer program is recorded in a storage medium such as a hard disc, a compact disc, a magneto-optical disc, a memory card or the like.

Figure 7A:
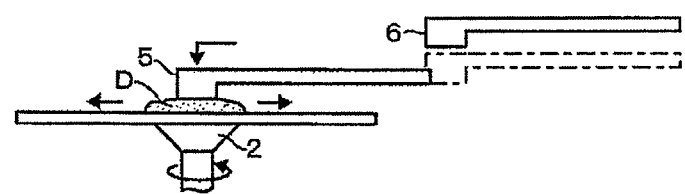
FIGS. 7A, 7B and 7C are process diagrams illustrating a developing process performed in a developing process section.
Figure 7B:
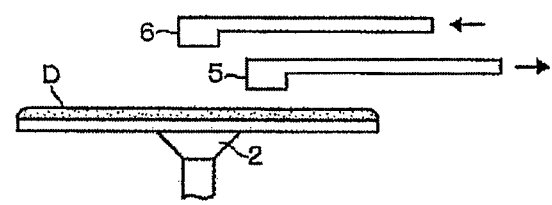
Figure 7C:
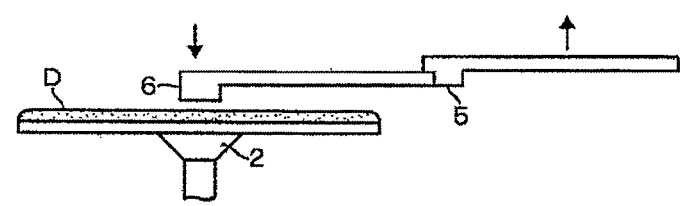

Based on the configuration described above, a sequence for subjecting the wafer W to a series of developing processes will be described with reference to FIGS. 7A to 7C. The wafer W is repeatedly loaded into the developing process sections 1A, 1B, 1C and 1D in the named order by an external transfer mechanism not shown. The wafers W loaded into the developing process sections 1A to 1D are coated with a resist, and the resist is subjected to a specified exposure process.

First, the interiors of the respective cup bodies 3 are evacuated by an exhaust mechanism (not shown) through the common exhaust path 30, the dedicated exhaust paths 38 and the exhaust ports 37. Thus, an airflow indicated by dotted lines in FIG. 2 is formed within the cup body 3, whereby the interior of the cup body 3 is evacuated. As mentioned above, the exhaust port 37 is formed at one side (one half side) of the bottom surface portion of the cup body 3. The airflow controlling partition wall portion 36 is installed at the upstream side of the exhaust port 37 when viewed from the stream of the airflow. The partition wall portion 36 decreases pressure. Consequently, in one side region of the cup body 3 in which the exhaust port 37 is formed, the evacuation is suppressed by the partition wall portion 36. Thus, the degree of evacuation is made uniform in the region where the exhaust port 37 is formed and in the region where the exhaust port 37 is not formed. This may cause the airflow of the cup body 3 to be more uniform in the circumferential direction.

If the interiors of the respective cup bodies 3 are evacuated in a specified evacuation amount, the wafer W is loaded by the transfer mechanism to the upper side of the opening 31 of the cup body 3 through the opening 43 of the case body 4 of the developing process section 1A. In cooperation with the support pins 39, the wafer W is delivered onto the spin chuck 2 and is put into the cup body 3. Then, upon receiving a control signal from the control unit 100, the first nozzle 5 is moved from the waiting position to the supplying position. The discharge port 54 is moved down to a height position which is 15 mm to 20 mm higher than the front surface of the wafer W. Subsequently, as shown in FIG. 7A, the developing liquid is supplied from the first nozzle 5 to the region including the central portion of the wafer W while rotating the wafer W with the spin chuck 2. The developing liquid D supplied onto the central portion of the wafer W is spread toward the peripheral edge portion of the wafer W and is coated on the entire front surface of the wafer W by spin coating. While discharging the developing liquid, the first nozzle 5 may be moved forward and backward in the front-rear direction between the central portion of the wafer W and the outer side of the wafer W.

If a predetermined time elapses after the discharge of the developing liquid from the first nozzle 5 is started, the supply of the developing liquid is stopped and the first nozzle 5 is moved back to the waiting position. The second nozzle 6 is moved so that the cleaning nozzle portion 64 may be located at the supplying position. Since the positions of the first nozzle 5 and the second nozzle 6 are set as mentioned above, the second nozzle 6 is driven so as to move over the first nozzle 5 to the front side of the first nozzle 5, as shown in FIG. 7B, and then move downward. Thus, the cleaning nozzle portion 64 of the second nozzle 6 is located at the supplying position and the discharge port 641 is positioned 15 mm to 20 mm higher than the front surface of the wafer W (see FIG. 7C). Then, while rotating the wafer W, pure water as the cleaning liquid is discharged toward the region including the central portion of the front surface of the wafer W. Under the action of a centrifugal force of the wafer W, the cleaning liquid thus discharged is spread outward along the liquid surface, thereby washing away the developing liquid including a dissolved component of the resist on the front surface of the wafer W. As a result, the front surface of the wafer W is cleaned.

If a predetermined time elapses after the discharge of the cleaning liquid is started, the supply of the cleaning liquid is stopped. The second nozzle 6 is moved forward or backward such that the drying gas nozzle portion 65 is positioned at the supplying position. Then, nitrogen gas as the drying gas is supplied to the region including the central portion of the wafer W. An airflow moving from the central portion toward the peripheral edge portion of the wafer W is formed by supplying the drying gas and evacuating the interior of the cup body 3. Under the action of the airflow and the centrifugal force, the liquid adhering to the wafer W is removed from the wafer W. Thus, the wafer W is dried.

If the drying of the wafer W is finished, the supply of the drying gas from the drying gas nozzle portion 65 is stopped, and the second nozzle 6 is moved to the waiting position. The rotation of the spin chuck 2 is stopped, and the wafer W is unloaded outside the developing apparatus through the opening 43 of the case body 4 by the cooperation of the external transfer mechanism and the support pins 39. In the developing process sections 1B to 1D, the same processes as those performed in the developing process section 1A are performed with respect to the respective wafers W. In this way, the wafers W are loaded into developing process sections 1A, 1B, 1C and 1D in turn and are subjected to a series of developing processes in a similar manner.

According to the embodiment described above, the nozzles for supplying the processing fluid to the wafer W are configured to move forward and backward in the front-rear direction intersecting the arrangement direction of the spin chucks 2 (the left-right direction) between the supplying position in which the developing liquid is supplied to the wafer W existing on the spin chuck 2 and the waiting position which is defined outside the cup body 3. The wafer W is delivered to the spin chuck 2 at the front side in the front-rear direction intersecting the arrangement direction of the spin chucks 2. Thus, when viewed from the wafer W delivered to the spin chuck 2, the nozzles are installed at the back side of the spin chuck 2. For that reason, there is no need to secure nozzle installation spaces in the arrangement direction of the spin chucks 2.

Accordingly, even if a plurality of spin chucks 2 are used, a plurality of nozzles for the spin chucks 2 may be provided while keeping the dimension of the apparatus in the front-rear direction, i.e., the advance/retreat direction of the nozzles, identical with the dimension of the apparatus available when a single spin chuck 2 is provided. The dimension of the apparatus in the left-right direction is increased as much as the spaces of the cup bodies 3 which are the processing spaces of the wafers W. In contrast, in case an apparatus is configured such that the nozzles are installed side by side with the spin chucks 2, if the number of the spin chucks 2 is increased, there is a need to secure not only the spaces for the cup bodies 3 but also the nozzle installation spaces. Accordingly, in the configuration of the present disclosure, it is possible to reduce the overall size of the when a plurality of spin chucks 2 are used. The arrangement direction of the spin chucks 2 is the same as the transfer direction of the wafer W. Therefore, if the increase of the apparatus length in the arrangement direction is suppressed when arranging a plurality of spin chucks 2, it is possible to reduce the time required in transferring the wafer W, thus suppressing deterioration of throughput.

As mentioned above, the nozzle is installed at the back side of the spin chuck 2 when viewed from the wafer W. It is therefore possible to increase the number of nozzles without changing the apparatus dimension in the arrangement direction of the spin chucks 2. Since the number of nozzles can be changed without changing the apparatus dimension, liquid processing using a plurality of processing fluids or processing gases may be performed for a single spin chuck 2, thus increasing a degree of freedom of processing.

Each of the spin chucks 2 is doubly surrounded by the cup body 3 and the case body 4 that has the sidewall 41 having upper edges higher than the cup body 3. It is therefore possible to suppress outflow of splash, i.e., scattering, of the processing fluid and the mist of the processing fluid. Since the splash of the processing fluid and the mist may cause particles, the installation of the case body 4 restrains the particles from being generated. In addition, the case body 4 prevents inflow of external particles.

The nozzle merely moves forward and backward in the front-rear direction and does not moved in the left-right direction. The opening 42 formed in the case body 4 is set into such a dimension as to enable the nozzle to move forward and backward. Therefore, as compared with an apparatus in which the nozzle moves in the left-right direction, the opening 42 formed in the case body 4 can be made small. This helps suppress the outflow of splash or mist of the processing fluid the mist or the inflow of the external particles. In addition, the opening 42 for a nozzle and the opening 43 for a substrate can be opened and closed by the shutters 44 and 45, respectively. This makes it possible to close the openings 42 and 43 to the greatest degree during the liquid processing. Accordingly, the outflow of splash or mist of the processing fluid or the inflow of the external particles is further suppressed.

The partition wall portion 36 is installed within the cup body 3. The air flow formed within the cup body 3 may be controlled by adjusting a shape or an installation position of the partition wall portion 36. Therefore, although the exhaust port 37 is installed in a lopsided position to one side of the cup body 3, it is possible to form a circumferentially uniform airflow within the cup body 3. Accordingly, a degree of freedom in designing the apparatus increases when selecting the installation positions of the exhaust port 37 and the dedicated exhaust paths 38. The respective dedicated exhaust paths 38 converge to the common exhaust path 30 at the more downstream side than the downstream-most developing process section 1A. Therefore, the conductance becomes uniform, as compared with a configuration in which the dedicated exhaust paths extending from the respective cup bodies are directly connected to the common exhaust path. This makes it possible to suppress the backflow into the cup bodies 3. Moreover, the evacuation amount in the respective cup bodies 3 becomes uniform. This makes it possible to stably perform the evacuation.

In the present embodiment, one of the first nozzle 5 and the second nozzle 6 may be moved up and down. Further, the first arm portion 51 and the second arm portion 61 may be installed so as to move forward and backward along the base 52 and the base 62, respectively. Elevator mechanisms may be attached to the first arm portion 51 and the second arm portion 61, respectively. The first nozzle 5 and the second nozzle 6 may be respectively moved up and down by the elevator mechanisms. Instead of installing the case body 4, the cup body 3 may be installed to further extend upward and an opening for a nozzle and an opening for a substrate may be formed in the cup body 3. In this case, the cup body 3 corresponds to the enclosure member. In addition, the case body 4 may be configured such that the upper surface thereof is closed.

Figure 8A:
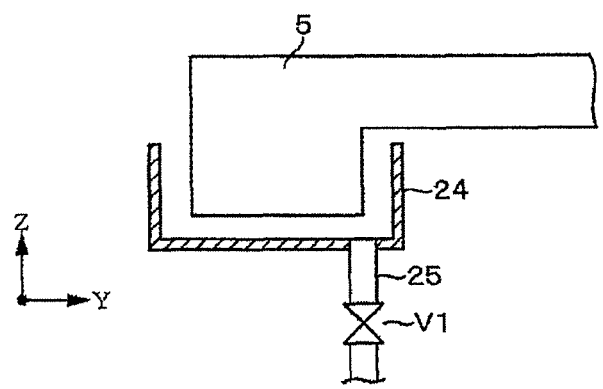
FIGS. 8A and 8B are a vertical sectional side view and a plan view showing a nozzle cleaning unit installed in a developing process section.
Figure 8B:
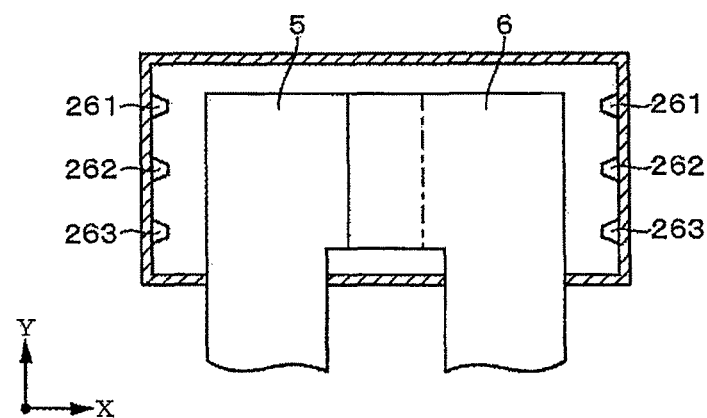

Subsequently, description will be made on another example of the liquid processing apparatus of the present disclosure. In this example, a nozzle cleaning unit 23 for cleaning a nozzle is installed outside the case body 4 and on a straight line joining the supplying position and the waiting position. For example, as indicated by a dotted line in FIG. 3, the nozzle cleaning unit 23 is installed at the immediately rear outer side of the opening 42 of the case body 4. For example, as shown in FIGS. 8A and 8B, the nozzle cleaning unit 23 includes a cleaning bath 24 that constitutes a liquid receiving portion in which the nozzles are accommodated. A drain pipe 25 provided with an opening/closing valve V1 is connected to the bottom surface of the cleaning bath 24. Since the first nozzle 5 is located at a lower position than the arm portion 51 and the second nozzle 6 is located at a lower position than the arm portion 61, the cleaning bath 24 is configured to accommodate, e.g., only the first nozzle 5 and the second nozzle 6. On the sidewall of the cleaning bath 24, there are installed discharge nozzles 261 for supplying a cleaning liquid used in cleaning the nozzles, discharge nozzles 262 for supplying pure water as a rinsing liquid used in washing away the cleaning liquid and discharge nozzles 263 for supplying a nitrogen gas as a drying gas. The discharge nozzles 261, 262 and 263 constitute a cleaning liquid supply section, a rinsing liquid supply section and a drying gas supply section, respectively. By closing the valve V1 installed in the drain pipe 25 and by supplying the cleaning liquid or the rinsing liquid from the discharge nozzles 261 or 262, the cleaning liquid or the rinsing liquid can be retained within the cleaning bath 24. By discharging the cleaning liquid from the discharge nozzles 261 to the first nozzle 5 and the second nozzle 6, it is possible to clean the distal end portions of the first nozzle 5 and second nozzle 6. Further, the distal end portions of the first nozzle 5 and second nozzle 6 can be cleaned by the cleaning liquid retained in the cleaning bath 24.

For example, as shown in FIG. 8B, the cleaning bath 24 is configured such that, when the first nozzle 5 and the second nozzle 6 stay in the waiting position, they are positioned above the cleaning bath 24. In FIG. 8B, the first nozzle 5 and the second nozzle 6 are depicted as if they overlap with each other. In reality, however, the second nozzle 6 is positioned above the first nozzle 5 as described above. The cleaning of the nozzles are sequentially performed with respect to the first nozzle 5 and the second nozzle 6, for example, after all the wafers W of a lot were subjected to the developing process. For example, when cleaning the first nozzle 5, the first nozzle 5 existing in the waiting position is moved down and consequently accommodated within the cleaning bath 24. In this state, the first nozzle 5 is cleaned. After the cleaning of the first nozzle 5 is finished, for example, the first nozzle 5 is positioned more frontward or backward than the cleaning bath 24 in the advance/retreat direction. Then, the second nozzle 6 existing in the waiting position is moved down and consequently accommodated within the cleaning bath 24 with no interference with the first nozzle 5. In this state, the second nozzle 6 is cleaned.

In this configuration, the nozzle cleaning unit 23 is installed in the advance/retreat direction of the nozzles. Thus, the cleaning of the nozzles can be performed by moving the nozzles forward and backward. This provides convenience. Since the nozzle cleaning unit 23 is arranged at the back side of the spin chuck 2 in the front-rear direction, it is possible to secure a cleaning space without increasing the left-right direction length of the apparatus. The nozzle cleaning unit (cleaning bath) of the type described above may be individually prepared with respect to the first nozzle 5 and the second nozzle 6. In this case, one of the cleaning baths and the other cleaning bath are arranged side by side in the left-right direction (the X-direction). This makes it possible to simultaneously clean the first nozzle 5 and the second nozzle 6, thus shortening the time required in performing the cleaning process.

Figure 9:
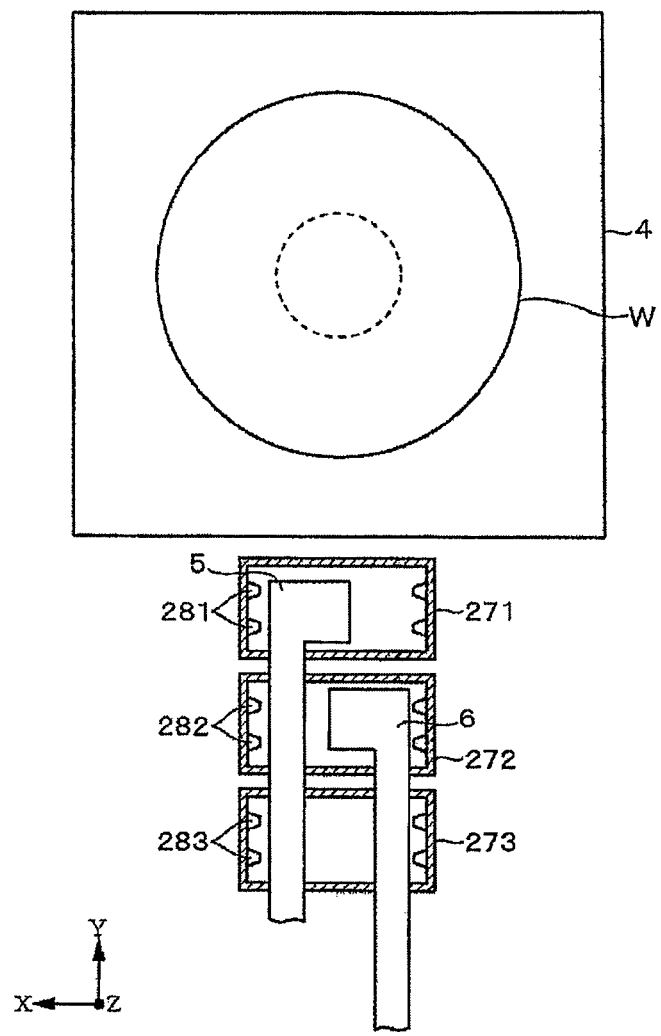
FIG. 9 is a plan view showing another example of the nozzle cleaning unit.

As shown in FIG. 9, the nozzle cleaning unit may be configured such that a cleaning bath 271 for supplying a cleaning liquid to the nozzles, a rinsing bath 272 for supplying a rinsing liquid to the nozzles and a drying bath 273 for supplying a drying gas to the nozzles are arranged side by side in the advance/retreat direction of the nozzles (in the Y-direction). Each of the cleaning bath 271, the rinsing bath 272 and the drying bath 273 is configured to accommodate the first nozzle 5 and the second nozzle 6. Discharge nozzles 281 which constitute a cleaning liquid supply section, discharge nozzles 282 which constitute a rinsing liquid supply section and discharge nozzles 283 which constitute a drying gas supply section, are installed in the cleaning bath 271, the rinsing bath 272 and the drying bath 273, respectively.

In this configuration, by moving the first nozzle 5 and the second nozzle 6 forward and backward, the nozzles 5 and 6 are accommodated within the cleaning bath 271, the rinsing bath 272 and the drying bath 273 in the named order. Cleaning process is performed by supplying the cleaning liquid, etc., to the respective baths. Therefore, as shown in FIG. 9, for example, the cleaning liquid can be supplied to the first nozzle 5 in the cleaning bath 271 while supplying the rinsing liquid to the second nozzle 6 in the rinsing bath 272. In other words, without having to await the completion of cleaning of one nozzle, the cleaning of the other nozzle can be started, thus shortening the time required in performing the cleaning process. Since the respective baths are arranged along the front-rear direction, an increase in the left-right direction size of the apparatus is suppressed, thus securing a cleaning space.

Figure 10A:
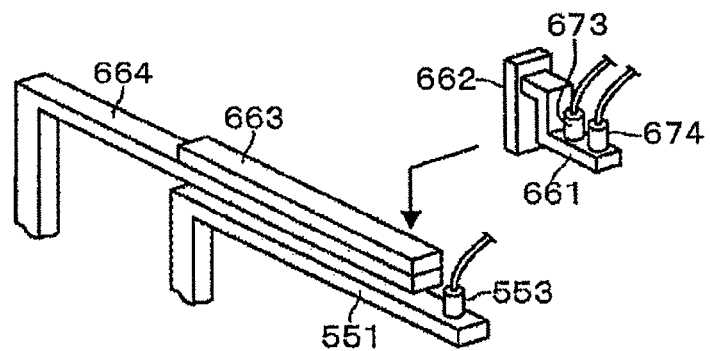
FIGS. 10A, 10B and 10C are a perspective view and vertical sectional side views showing another example of the nozzle.
Figure 10B:
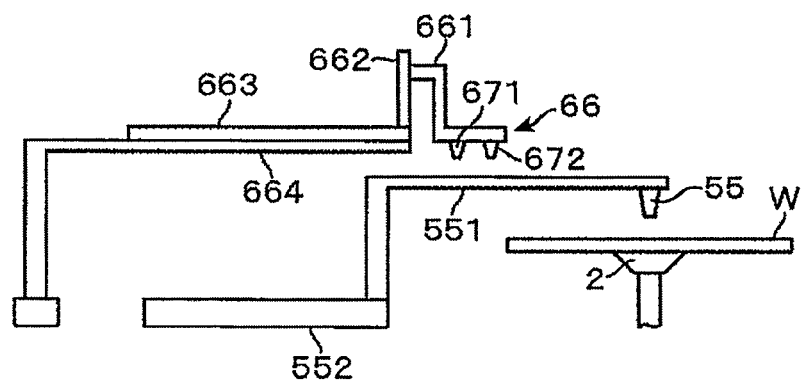
Figure 10C:
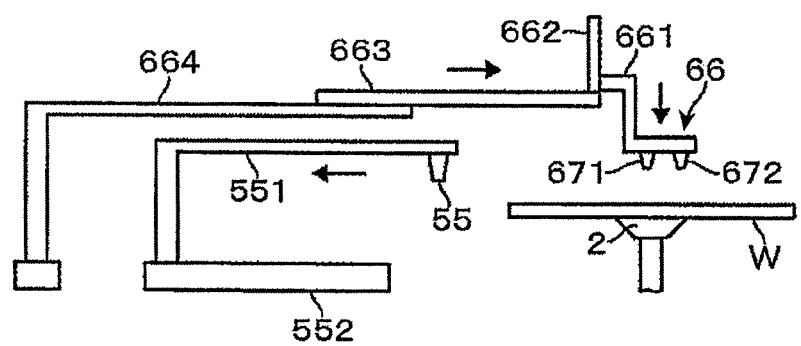

Subsequently, other examples of the first nozzle and the second nozzle will be described with reference to FIGS. 10A, 10B and 10C. One of the nozzles, namely a first nozzle 55 in the example, is configured to move forward and backward in the front-rear direction (the Y-direction). The other nozzle, namely a second nozzle 66 in this example, is configured to move up and down and to move forward and backward in the front-rear direction. The first nozzle 55 and the second nozzle 66 can move between a supplying position and a waiting position without interfering with each other. The first nozzle 55 is supported by a support member 551 serving as a nozzle moving mechanism and is configured to move along a base 552 horizontally extending in the front-rear direction. The support member 551 is formed in a substantially L-like shape such that the support member 551 extends upward from a base end thereof and then is bent to horizontally extend toward the spin chuck 2. The first nozzle 55 is installed on the lower surface of a distal end region of the support member 551. The base end portion of the support member 551 is configured to move along the base 552. Reference symbol 553 designates a developing liquid supply pipe.

The second nozzle 66 is formed from a composite nozzle that includes, e.g., a cleaning liquid nozzle portion 671 and a drying gas nozzle portion 672. The second nozzle 66 is supported by a support member 661 serving as an elevator mechanism which moves up and down along a guide plate 662 extending in the up-down direction. The guide plate 662 is attached to the upper surface of a horizontal moving body 663. The moving body 663 is configured to move along a base 664 horizontally extending in the front-rear direction. In this example, the support member 661 and the moving body 663 constitute a nozzle moving mechanism for the second nozzle 66. Just like the support member 551 of the first nozzle 55, the base 664 of the second nozzle 66 is formed in a substantially L-like shape such that the base 664 extends upward from a base end thereof and then is bent to horizontally extend toward the spin chuck 2. As shown in FIG. 10A, the base 664 of the second nozzle 66 and the support member 551 of the first nozzle 55 are installed such that base 664 is positioned above the support member 551 so as to overlap with each other when seen in a plan view. Reference symbols 673 and 674 designate a cleaning liquid supply pipe and a drying gas supply pipe, respectively.

In the aforementioned configuration, the first nozzle 55 is moved forward in the front-rear direction from the waiting position (the position shown in FIG. 10C) to the supplying position (the position shown in FIG. 10B), where the first nozzle 55 supplies the developing liquid to the wafer W existing on the spin chuck 2. Then, the first nozzle 55 is moved backward to the waiting position. Subsequently, the second nozzle 66 is moved forward in the front-rear direction from the waiting position (the position shown in FIG. 10B) to the supplying position (the position shown in FIG. 10C), where the second nozzle 66 supplies the cleaning liquid to the wafer W existing on the spin chuck 2. Then, the second nozzle 66 is moved backward to the waiting position. Even in this configuration, the first nozzle 55 and the second nozzle 66 can move between the supplying position and the waiting position without interfering with each other. The support member 551 of the first nozzle 55 and the base 664 of the second nozzle 66 are installed to overlap with each other when seen in a plan view, thus reducing the nozzle installation space.

Figure 11:
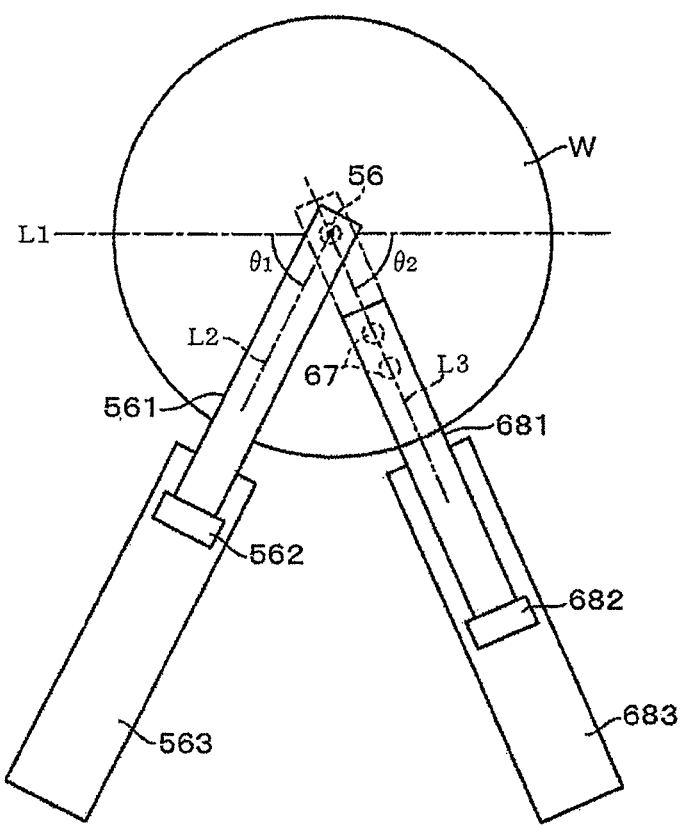
FIG. 11 is a plan view showing another example of the nozzle.

In the present disclosure, if a plurality of nozzles is installed, the waiting positions of the respective nozzles may be differently set along the advance/retreat direction of the nozzles. Moreover, in the present disclosure, the front-rear direction may be set such that angles θ1 and θ2 formed by the front-rear direction and the arrangement direction of the spin chucks 2 (the left-right direction) become equal to, e.g., 60 to 120 degrees. In this regard, θ1 and θ2 denote the angles formed by a straight line L1 extending in the arrangement direction through the center of the wafer W and straight lines L2 and L3 indicating the advance/retreat directions of the nozzles. For example, as shown in FIG. 11, the angles θ1 and θ2 are suitably set such that the first nozzle and the second nozzle can move forward and backward between the supplying position and the waiting position without interfering with each other. In this example, a first nozzle 56 is supported by a first arm portion 561 and is configured to be moved forward and backward along a base 563 by a moving mechanism 562. Further, a second nozzle 67 is supported by a second arm portion 681 and is configured to be moved forward and backward along a base 683 by a moving mechanism 682. The first nozzle 56 and the second nozzle 67 are installed in such positions that, when the first nozzle 56 and the second nozzle 67 are alternately moved into the supplying position, they do not interfere with each other. Thus, there is no need to move at least one of the first nozzle 56 and the second nozzle 67 up and down. Thus, the first nozzle 56 and the second nozzle 67 can be configured to move forward and backward at the same height position.

The first nozzle 56 and the second nozzle 67 configured as shown in FIG. 11 may be installed so as to move forward and backward in the direction orthogonal to the row of the spin chucks 2 as substrate holding units. In this case, the first arm portion 561 of the first nozzle 56 and the second arm portion 681 of the second nozzle 67 are spaced apart from each other in the left-right direction such that the longitudinal directions thereof can be oriented in the orthogonal direction. Further, the first arm portion 561 of the first nozzle 56 and the second arm portion 681 of the second nozzle 67 are installed such that, when the first nozzle and the second nozzle are alternately moved into the supplying position, they do not interfere with each other when seen in a plan view. In this case, it is possible to employ, e.g., a configuration in which one of the first nozzle 56 and the second nozzle 67 discharges a processing liquid toward the region including the central portion of the wafer W and the other nozzle discharges a processing fluid, e.g., a drying gas, toward the region spaced apart from the central portion of the wafer W. In the case where the other nozzle discharges a drying gas, the discharge port of the nozzle may be oriented to face the central portion of the wafer W. Alternatively, in this example, the other nozzle may be configured to discharge a processing liquid.

Figure 12:
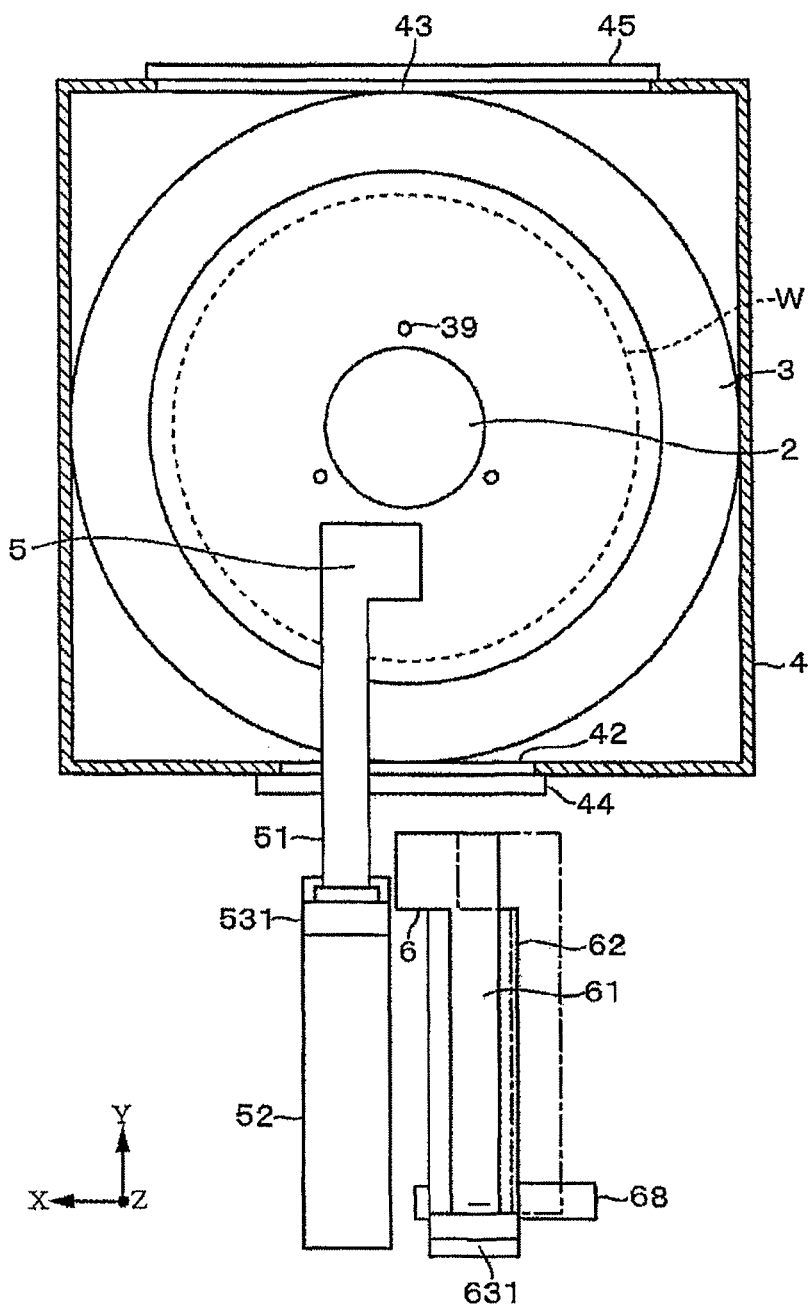
FIG. 12 is a plan view showing another example of the nozzle.

As shown in FIG. 12, the second nozzle 6 may be slightly shifted in the arrangement direction of the spin chucks 2 (the X-direction) so that the second nozzle 6 can move forward and backward in the Y-direction while suppressing the interference of the second nozzle 6 with the first nozzle 5. In this example, for example, the second nozzle 6 is installed at the same height position as the first nozzle 5. The base 62 of the second nozzle 6 is configured to move along a guide rail 68 extending in the X-direction. For example, when the first nozzle 5 and the second nozzle 6 are in the waiting position, the second nozzle 6 is spaced apart from the first nozzle 5 in the left-right direction so as to lie in a position where the second nozzle 6 does not interfere with the first nozzle 5, as indicated by a single-dot chain line in FIG. 12.

When moving the second nozzle 6 to the supplying position, the second nozzle 6 is directly moved forward so as to reach a lopsided position to one side of the supplying position, namely the right side of the supplying position in this example. Thereafter, the second nozzle 6 is slid leftward to reach the supplying position. This configuration is also included in the case where the second nozzle 6 is moved forward and backward in the front-rear direction between the supplying position in which the processing fluid is supplied to the wafer W held in the spin chuck 2 and the waiting position.

In the present embodiment, a single nozzle may be installed in each and every spin chuck 2. For example, like the composite nozzle shown in FIG. 5B, the single nozzle is configured to include a plurality of nozzle portions for discharging different liquids or gases. For example, a nozzle section for discharging a developing liquid as a first processing fluid, a nozzle section for discharging a cleaning liquid as a second processing fluid and a nozzle section for discharging a drying gas are installed in a signal nozzle. In this case, the nozzle section for discharging the developing liquid corresponds to the first nozzle and the nozzle section for discharging the cleaning liquid corresponds to the second nozzle. In this configuration, the first nozzle and the second nozzle are supported by a common arm portion and are jointly moved forward and backward by a nozzle moving mechanism.

The liquid processing apparatus of the present disclosure is also applicable to a case where a single spin chuck is used as a substrate holding unit and a plurality of nozzles for supplying processing fluids to a wafer W held in the spin chuck is installed. The nozzles are installed at the back side of the spin chuck when viewed from the wafer loaded onto the spin chuck. Therefore, even when a plurality of nozzles are installed with respect to a single spin chuck, it is possible to increase the number of nozzles while keeping the apparatus dimension identical with the apparatus dimension available when a single spin chuck is installed, thus suppressing an increase in the apparatus size. In contrast, in the configuration in which the nozzles are installed side by side with the spin chucks 2 in the left-right direction, if a plurality of nozzles are employed, the apparatus dimension in the left-right direction is increased just as much as the nozzle installation spaces. Thus, the size of the apparatus becomes larger. The left-right direction is parallel to the transfer region of the wafer W. If the left-right direction dimension of the apparatus becomes larger, the transfer region of the wafer W grows longer, just as much as the increase in the left-right direction dimension of the apparatus. For that reason, a longer period of time is required in transferring the wafer W, which leads to reduced throughput. Accordingly, as in the present disclosure, it is effective to employ the configuration capable of reducing the left-right direction dimension of the liquid processing apparatus. Even in this case, the composite nozzle shown in FIG. 5B may be used. A nozzle section which constitutes a first nozzle for discharging a first processing fluid and a nozzle section which constitutes a second nozzle for discharging a second processing fluid may be installed in one of the nozzles.

Figure 13:
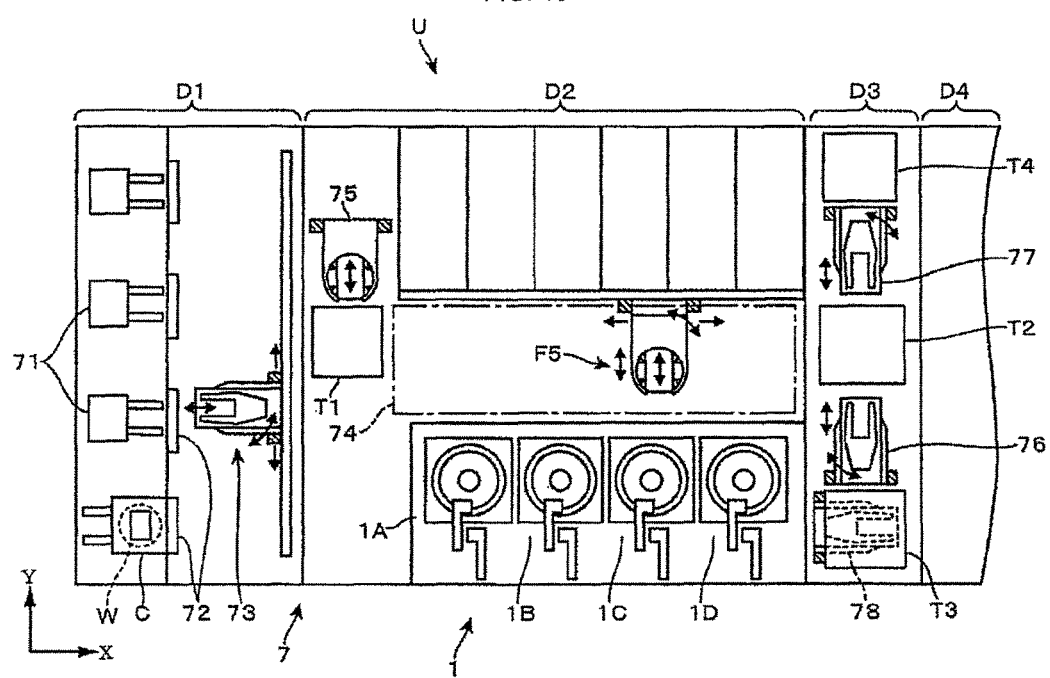
FIG. 13 is a plan view showing a coating/developing apparatus that incorporates a developing apparatus.
Figure 14:
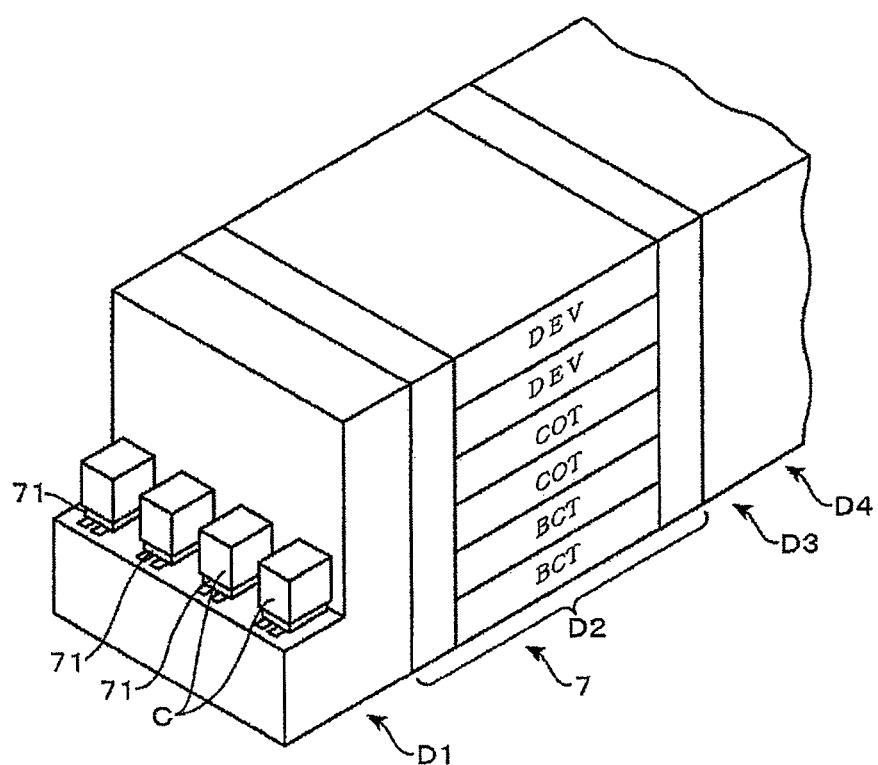
FIG. 14 is a perspective view showing a coating/developing apparatus.
Figure 15:
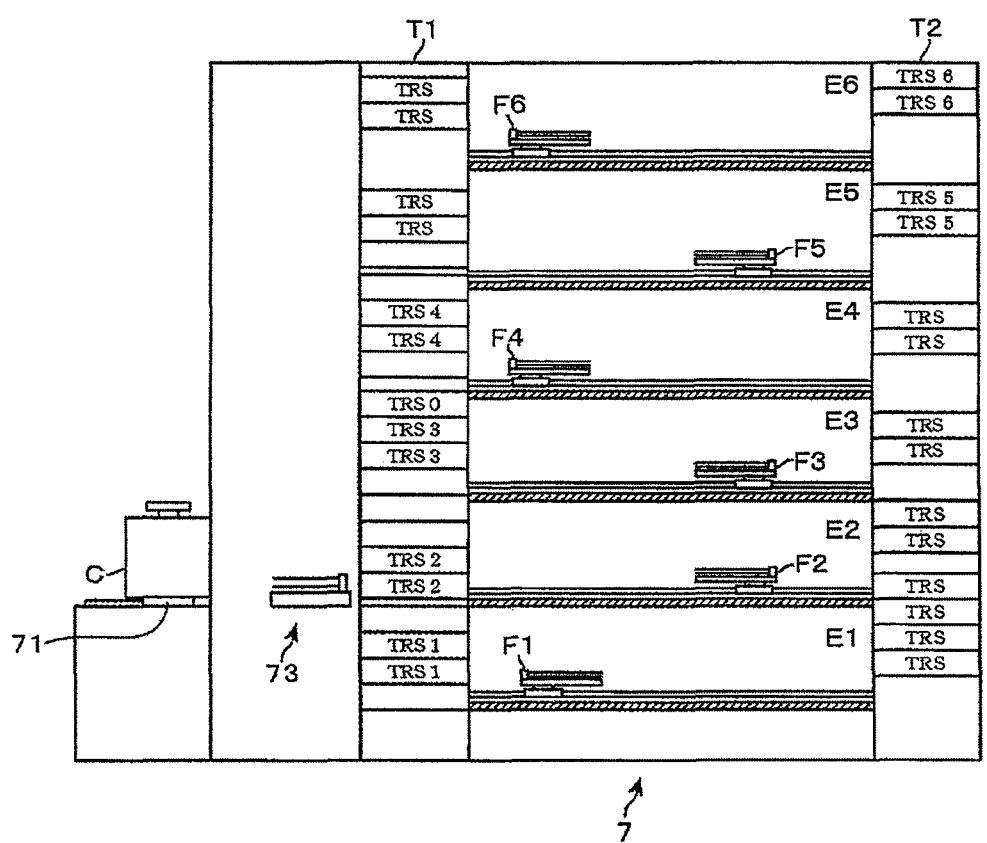
FIG. 15 is a vertical sectional side view showing a coating/developing apparatus.

FIGS. 13 to 15 show an example of the coating/developing apparatus that incorporates the developing process sections 1 described above. FIGS. 13, 14 and 15 are plan, perspective, and schematic vertical sectional side views of the coating/developing apparatus 7, respectively. The coating/developing apparatus 7 includes a carrier block D1, a processing block D2, and an interface block D3 which are serially connected to one another. An exposure apparatus D4 is connected to the interface block D3. In the following description, the arrangement direction of the blocks D1 to D3 will be referred to as a left-right direction (an X-direction). The carrier block D1 serves to carry a carrier C including a plurality of wafers W as substrates of the same lot into and out of the coating/developing apparatus 7. The carrier block D1 includes mounting stands 71 for the carrier C, opening/closing portions 72, and a transfer mechanism 73 for transferring the wafers W from the carrier C through the opening/closing portions 72.

The processing block D2 is configured by stacking first to sixth unit blocks E1 to E6 for performing liquid processing with respect to the wafers W in turns from below. For the sake of convenience in description, a process for forming a lower-layer-side antireflection film on the wafer W will be sometimes referred to as "BCT". A process for forming a resist film on the wafer W will be occasionally referred to as "COT". A process for forming a resist pattern on the exposed wafer W will be often referred to as "DEV". In this example, as shown in FIG. 14, two BCT layers, two COT layers and two DEV layers are stacked in turn from below. In the same unit block, the transfer and processing of the wafer W are performed in parallel with each other.

Now, the DEV layers of the unit blocks E5 and E6 will be representatively described with reference to FIG. 13. A plurality of rack units U is arranged along the left-right direction at one of front and rear sides of a transfer region 74 extending from the carrier block D1 to the interface block D3. The developing process sections 1 of the present disclosure are installed at the other side of the transfer region 74. Each of the rack units U is provided with a heating module. A transfer arm F5 as a transfer mechanism of the wafer W is installed in the transfer region 74.

The remaining unit blocks E1, E2, E3 and E4 have the same configuration as the unit blocks E5 and E6 except a difference in the chemical liquid supplied to the wafer W. Each of the unit blocks E1 and E2 includes an antireflection film forming module in place of the developing process section 1. Each of the unit blocks E3 and E4 includes a resist film forming module COT in place of the developing process section 1. In FIG. 15, the transfer arms of the respective unit blocks E1 to E6 are designated by reference symbols F1 to F6.

In the region of the processing block D2 near the carrier block D1, there are installed a tower T1 extending up and down over the respective unit blocks E1 to E6 and a vertically movable delivery arm 75 for performing delivery of the wafers W with respect to the tower T1. The tower T1 is configured by a plurality of modules stacked one above another. The modules installed in alignment with the respective height positions of the unit blocks E1 to E6 can deliver the wafers W between themselves and the respective transfer arms F1 to F6 of the unit blocks E1 to E6. The modules include delivery modules TRS, temperature-adjusting modules for adjusting the temperature of the wafers W, buffer modules for temporarily storing the wafers W and hydrophobizing modules for hydrophobizing the front surfaces of the wafers W.

The interface block D3 includes towers T2, T3 and T4 extending up and down over the unit blocks E1 to E6. With respect to the towers T2 and T3, the delivery of the wafers W is performed by a vertically movable interface arm 76. With respect to the towers T2 and T4, the delivery of the wafers W is performed by a vertically movable interface arm 77. There is also installed an interface arm 78 for performing the delivery of the wafers W between the tower T2 and the exposure apparatus D4. In the tower T2, delivery modules TRS, buffer modules, and temperature-adjusting modules for adjusting the temperature of the wafer W are stacked one above another. In addition, modules are also installed in the towers T3 and T4. These modules will not be described here.

Description will now be made on the transfer routes of the wafers W in a system including the coating/developing apparatus 7 and the exposure apparatus D4. The wafers W are unloaded from the carrier C on a lot-by-lot basis. In other words, after removing all the wafers W of one lot, the wafers W of another lot are unloaded from the carrier C. The transfer routes of the respective wafers W are set in advance before the wafers W are removed from the carrier C. The wafers W are transferred to the predetermined unit blocks among the unit blocks duplexed as above.

The wafers W are transferred from the carrier C to the delivery module TRS0 of the tower T1 of the processing block D2 by the transfer mechanism 73. The wafers W are sorted and transferred from the delivery module TRS0 to the unit blocks E1 and E2. For example, when delivering the wafers W to the first unit block E1, the wafers W are delivered from the delivery module TRS0 to the delivery module TRS1 corresponding to the first unit block E1 (the delivery module to which the wafers W can be delivered by the transfer arm F1) among the delivery modules TRS of the tower T1. When delivering the wafers W to the second unit block E2, the wafers W are delivered from the delivery module TRS0 to the delivery module TRS2 corresponding to the second unit block E2 among the delivery modules TRS of the tower T1. The delivery of the wafers W is performed by the delivery arm 75.

The wafers W thus sorted are transferred to the delivery module TRS1 (TRS2), the antireflection film forming module, the heating module and the delivery module TRS1 (TRS2) in the named order. Subsequently, the wafers W are assigned by the delivery arm 75 to the delivery module TRS3 corresponding to the third unit block E3 and the delivery module TRS4 corresponding to the fourth unit block E4. The wafers W assigned to the delivery modules TRS3 and TRS4 are transferred to the delivery module TRS3 (TRS4), the resist film forming module COT, the heating module, the protection film forming module ITC, the heating module, and the delivery modules TRS of the tower T2 in the named order. The wafers W transferred to the delivery modules TRS are carried into the exposure apparatus D4 through the tower T3 by the interface arms 76 and 78. The wafers W exposed in the exposure apparatus D4 are transferred between the towers T2 and T4 by the interface arm 77 and are respectively transferred to the delivery modules TRS5 and TRS6 of the tower T2 corresponding to the unit blocks E5 and E6. Thereafter, the wafers W are transferred to the heating module, the developing process section 1, the heating module, and the delivery modules TRS of the tower T1 in the named order and are then returned to the carrier C through the transfer mechanism 73.

The liquid processing apparatus of the present disclosure is applicable to a liquid processing apparatus that performs liquid processing by supplying a resist liquid, an antireflection-film-forming chemical solution, a wet-etching chemical solution, a rinsing liquid (a cleaning liquid) and the like to a substrate, or a liquid processing apparatus that supplies a liquid adhesive agent as a processing fluid to a substrate in order to bond the substrate to a bonding object (e.g., a substrate). The kind of first processing fluid and second processing fluid respectively discharged from the first nozzle and the second nozzle are not limited to the one mentioned in the aforementioned embodiment. For example, it may be possible to employ a configuration in which a nozzle section for discharging a developing liquid and a nozzle section for discharging a rinsing liquid (a cleaning liquid) are installed in the first nozzle and in which a nozzle section for supplying a drying gas is installed in the second nozzle. In this case, the developing liquid and the rinsing liquid correspond to the first processing fluid. The drying gas corresponds to the second processing fluid.

A vapor or a mist is also included in the processing fluids of the present disclosure. For example, an organic solvent vapor used in a process (a smoothing process) in which a resist surface is dissolved by supplying an organic solvent vapor such as N-methylpyrrolidone or ethyl lactate to a developed resist pattern is included in the processing fluids. Moreover, a vapor or a mist used in a process (a cleaning process) in which a substrate is cleaned by forming a cleaning liquid into liquid droplets with a liquid-droplet forming mechanism such as a two-fluid spray, or a process (a drying process) in which a substrate is dried by supplying a vapor or a mist of, e.g., isopropyl alcohol (IPA), to the substrate after performing a rinsing process with a rinsing liquid, is included in the processing fluids.

According to the liquid processing apparatus of the present disclosure, a plurality of substrate holding units are arranged in a left-right direction. A substrate is loaded onto or unloaded from each of the substrate holding units at the front side of a front-rear direction intersecting the left-right direction. A nozzle for supplying a processing fluid to the substrate is configured to move forward and backward in the front-rear direction from a waiting position defined at the rear side of the front-rear direction. Therefore, when viewed from the substrate delivered to each of the substrate holding units, the nozzle is installed at the back side of each of the substrate holding units. This eliminates the need to secure nozzle installation spaces in the left-right direction, namely in the arrangement direction of the substrate holding units. Accordingly, even when a plurality of substrate holding units are arranged, it is possible to install a plurality of nozzles for the substrate holding units while keeping the apparatus dimension in the front-rear direction identical with the apparatus dimension available when a single substrate holding unit is installed. Further, the dimension of the apparatus in the left-right direction is increased as much as the substrate processing spaces. Since there is no need to additionally provide nozzle installation spaces in the left-right direction, it is possible to reduce the size of the apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A liquid processing apparatus for performing liquid processing with respect to a substrate using processing fluid, comprising:
   a plurality of substrate holding units arranged side by side in a left-right direction, each of the substrate holding units configured to horizontally hold the substrate;
   a plurality of cup bodies installed in the plurality of substrate holding units, respectively, and having a ring shape to surround, over an entire circumference, a lateral side and a lower side of the substrate;

a plurality of partition members configured to partition cup body regions where the plurality of cup bodies are arranged in the liquid processing apparatus from each other, and extend to a position higher than an upper end of each of the plurality of cup bodies;

a processing fluid nozzle provided in a corresponding relationship with each of the plurality of substrate holding units, and installed in each of the plurality of substrate holding units in which the substrate is held, the processing fluid nozzle including a first nozzle configured to supply a first processing fluid to the substrate and a second nozzle configured to supply a second processing fluid different from the first processing fluid to the substrate; and a nozzle moving mechanism including a first arm portion in which the first nozzle and the second nozzle are jointly provided, and configured to jointly move the first nozzle and the second nozzle forward and backward in a front-rear direction intersecting an arrangement direction of the substrate holding units between a supplying position in which the processing fluid is supplied to a region including a central portion of the substrate and a waiting position which is defined at a rear side of a row of the substrate holding units opposite to a front side of the row of the substrate holding units at which the substrate is loaded and unloaded.

2. The apparatus of claim 1, further comprising a third nozzle different from the processing fluid nozzle, wherein the nozzle moving mechanism further includes a second arm portion configured to move the third nozzle forward and backward in the front-rear direction intersecting the arrangement direction of the substrate holding units between a supplying position and the waiting position.

3. The apparatus of claim 2, wherein the first arm portion and the second arm portion are spaced apart from each other in the left-right direction.

4. The apparatus of claim 2, wherein the first arm portion and the second arm portion are spaced apart from each other in the left-right direction, the processing fluid nozzle and the third nozzle are installed in such positions that, when alternately moved into the supplying position, the processing fluid nozzle and the third nozzle interfere with each other when seen in a plan view, and the nozzle moving mechanism includes an elevator mechanism configured to move at least one of the processing fluid nozzle and the third nozzle up and down in order to prevent the processing fluid nozzle and the third nozzle from interfering with each other.

5. The apparatus of claim 4, wherein the elevator mechanism is configured to move at least one of the first arm portion and the second arm portion up and down.

6. The apparatus of claim 1, wherein the processing fluid nozzle is configured to move forward and backward in a direction intersecting the arrangement direction of the substrate holding units.

7. The apparatus of claim 1, further comprising:

a plurality of enclosure members installed in the substrate holding units, respectively, and configured to surround the substrate and a space existing above the substrate, each of the plurality of enclosure members including a sidewall and an opening for the processing fluid nozzle formed in the sidewall, the opening for the processing fluid nozzle configured to allow the processing fluid nozzle to pass therethrough, wherein the plurality of enclosure members separate the plurality of substrate holding units from each other.

8. The apparatus of claim 7, wherein each of the plurality of enclosure members is configured to surround a lateral side of each of the plurality of cup bodies over the entire circumference and the sidewall of each of the plurality of enclosure members includes an upper edge higher than each of the plurality of cup bodies.

9. The apparatus of claim 7, wherein an opening for a substrate is formed in the sidewall of each of the plurality of enclosure members, the opening for a substrate configured to load and unload the substrate therethrough.

10. The apparatus of claim 9, wherein shutters configured to open and close the opening for the processing fluid nozzle and the opening for a substrate are located in each of the plurality of enclosure members.

11. The apparatus of claim 1, further comprising:

an exhaust path connected to the exhaust port in order to exhaust an ambient air existing within each of the plurality of cup bodies, the exhaust path extending toward the front side when viewed from the row of the substrate holding units, wherein each of the plurality of cup bodies including a bottom surface portion and an exhaust port formed in the bottom surface portion.

12. The apparatus of claim 1, further comprising:

a nozzle cleaning unit configured to clean the processing fluid nozzle, the nozzle cleaning unit located on a straight line joining the supplying position and the waiting position.

13. The apparatus of claim 12, wherein the nozzle cleaning unit includes a cleaning liquid supply section configured to supply cleaning liquid to the processing fluid nozzle, a rinsing liquid supply section configured to supply a rinsing liquid to the processing fluid nozzle, and a drying gas supply section configured to supply drying gas to the processing fluid nozzle, the cleaning liquid supply section, the rinsing liquid supply section, and the drying gas supply section arranged along an advance/retreat direction of the processing fluid nozzle.

14. The apparatus of claim 13, wherein the nozzle cleaning unit includes a liquid receiving portion configured to receive liquid, the cleaning liquid supply section, the rinsing liquid supply section, and the drying gas supply section being located in the liquid receiving portion.

15. The apparatus of claim 1, wherein a waiting position of the first nozzle and a waiting position of the second nozzle are arranged so as to deviate from each other in an advance/retreat direction of the first nozzle and the second nozzle.

* * * * *